United States Patent [19]

Rolfs, deceased

[11] Patent Number: 4,692,766
[45] Date of Patent: Sep. 8, 1987

[54] LINEARIZER FREQUENCY DISCRIMINATOR FOR FREQUENCY MODULATED RADAR TRANSMITTERS

[76] Inventors: John C. Rolfs, deceased, late of Palm Harbor; by Margaret H. Rolfs, ececutrix, 1637 Wendle Way, Palm Harbor, both of Fla. 33563

[21] Appl. No.: 780,114

[22] Filed: Sep. 25, 1985

[51] Int. Cl.$^4$ .......................... G01S 13/32; G01S 7/40
[52] U.S. Cl. ..................................... 342/200; 342/174; 331/4
[58] Field of Search .................. 343/14, 17.7, 17.5; 331/4, 178; 342/122, 128, 173, 174, 200

[56] References Cited

U.S. PATENT DOCUMENTS

| | | | |
|---|---|---|---|
| 3,221,266 | 11/1965 | Vitkovits, Jr. .......................... 331/4 |
| 3,341,849 | 9/1967 | Cordry et al. .................... 343/17.7 |
| 4,008,475 | 2/1977 | Johnson ................................. 343/14 |
| 4,106,020 | 8/1978 | Johnson ......................... 343/17.7 X |
| 4,245,196 | 1/1981 | Peebles, Jr. et al. ............... 331/4 X |
| 4,245,221 | 1/1981 | Kipp et al. ......................... 343/14 X |
| 4,276,549 | 6/1981 | Tomasi ............................. 343/14 X |

Primary Examiner—T. H. Tubbesing
Assistant Examiner—Mark Hellner
Attorney, Agent, or Firm—Seymour Levine; Michael B. Keehan

[57] ABSTRACT

Signals to control the signal processor in the linearizer of a frequency modulated continuous wave radar transmitter are generated by sampling the signal being transmitted, modulating and delaying this signal, mixing the modulated delayed signal with a second sample of the signal being transmitted to obtain an intermediate frequency signal, filtering the intermediate frequency signal to isolate the upper and lower sidebands of this signal and mixing the two sidebands to obtain a control signal having a frequency that varies directly with the beat frequency between the sampled and delayed signals.

6 Claims, 3 Drawing Figures

LINEARIZER FREQUENCY DISCRIMINATOR FOR FREQUENCY MODULATED RADAR TRANSMITTERS

BACKGROUND OF THE INVENTION

1. Field of the Invention

The invention relates to frequency modulated, continuous wave radar systems, and more specifically to linear frequency sweep generators for use in such radar systems.

2. Description of the Prior Art

Range resolution of frequency modulated continuous wave (FMCW) radar systems is a function of the linearity of the transmitted signal frequency variation as a function of time.

The frequency sweep circuits in such systems typically employ a voltage controlled oscillator (VCO) which is tuned by means of a drive voltage that is either used to bias the VCO itself or to actuate a varactor diode installed in a microwave cavity associated with the VCO.

With either of the aforementioned tuning methods, the output frequency is a non-linear function of the drive voltage. Therefore in order to provide the necessary linear frequency sweep, a non-linear drive compensation circuit or linearizer must be utilized.

The foregoing situation may be better visualized by referring to FIGS. 1(a) and 1(b).

FIG. 1(a) illustrates the desired situation. The transmitted frequency rises linearly from time $t_0$ in a sawtooth pattern. At time $t_1$, the signal reflected from the target is received by the radar system. The frequency of the received signal also rises linearly at the same rate as the transmitted signal. The time $t_1$ of course, is dependent upon the distance to the target. The two signals are mixed in the radar system to provide a beat signal $f_B$ which is an indication of the distance to the target. Because of the linearity of the transmitted and received signals, the beat frequency remains constant throughout the cycle.

FIG. 1(b) illustrates a situation where the VCO is driven by a linear ramp voltage but the output of the VCO, and therefore the transmitted frequency, changes in a non-linear fashion. The delayed received signal frequency changes in the same fashion, but because of the non-linearity, the beat frequency changes throughout the cycle. Linearizers typically correct for this non-linearity by driving the VCO with a voltage ramp having an inversely curved voltage versus time characteristic.

Co-pending patent application Ser. No. 696,236 filed in the name of Richard W. Johnson and assigned to the present assignee, concerns a linearizer of the aforementioned type which includes an RF subassembly, an IF subassembly, and a processor subassembly. The RF subassembly includes a VCO which provides the FMCW signal to be transmitted. This subassembly also includes means for sampling the signal to be transmitted, delay means for delaying the sampled signal, modulating means for modulating the delayed signal, means for delaying the modulated signal, and means for mixing this twice-delayed signal with the output sample from the VCO.

In the IF subassembly, the signal from the mixing means is filtered and mixed with a sample of the signal which actuates the modulator to provide the beat signal between the sampled transmitter signal and the internally delayed signal. This beat signal is applied to a zero crossing detector to provide timing signals for use in the processor subassembly. The processor subassembly is used to generate a sweep drive voltage to be applied to the VCO. This subassembly contains means to measure the slope of the resulting VCO frequency sweep versus time curve and means to generate error signals as well as corresponding correction signals which can be combined with the intrinsic drive voltage so as to produce the desired linear frequency sweep voltage.

The present invention provides simplified and improved RF and IF subassemblies to operate signal processors of the type disclosed in the linearizer of Ser. No. 696,236.

SUMMARY OF THE INVENTION

The output of the VCO in an FMCW linearizer is monitored, internally delayed, modulated by a signal at a frequency $f_M$, and mixed with a sample of the VCO output to produce an IF signal with upper and lower sidebands. The two sidebands are mixed to produce a signal having a frequency equal to twice the frequency between $f_M$ and the two sidebands. The resulting beat frequency signal is used to control a known type of signal processor to correct nonlinearities in the FMCW output of the VCO.

DESCRIPTION OF THE PREFERRED EMBODIMENT

Figure 2:
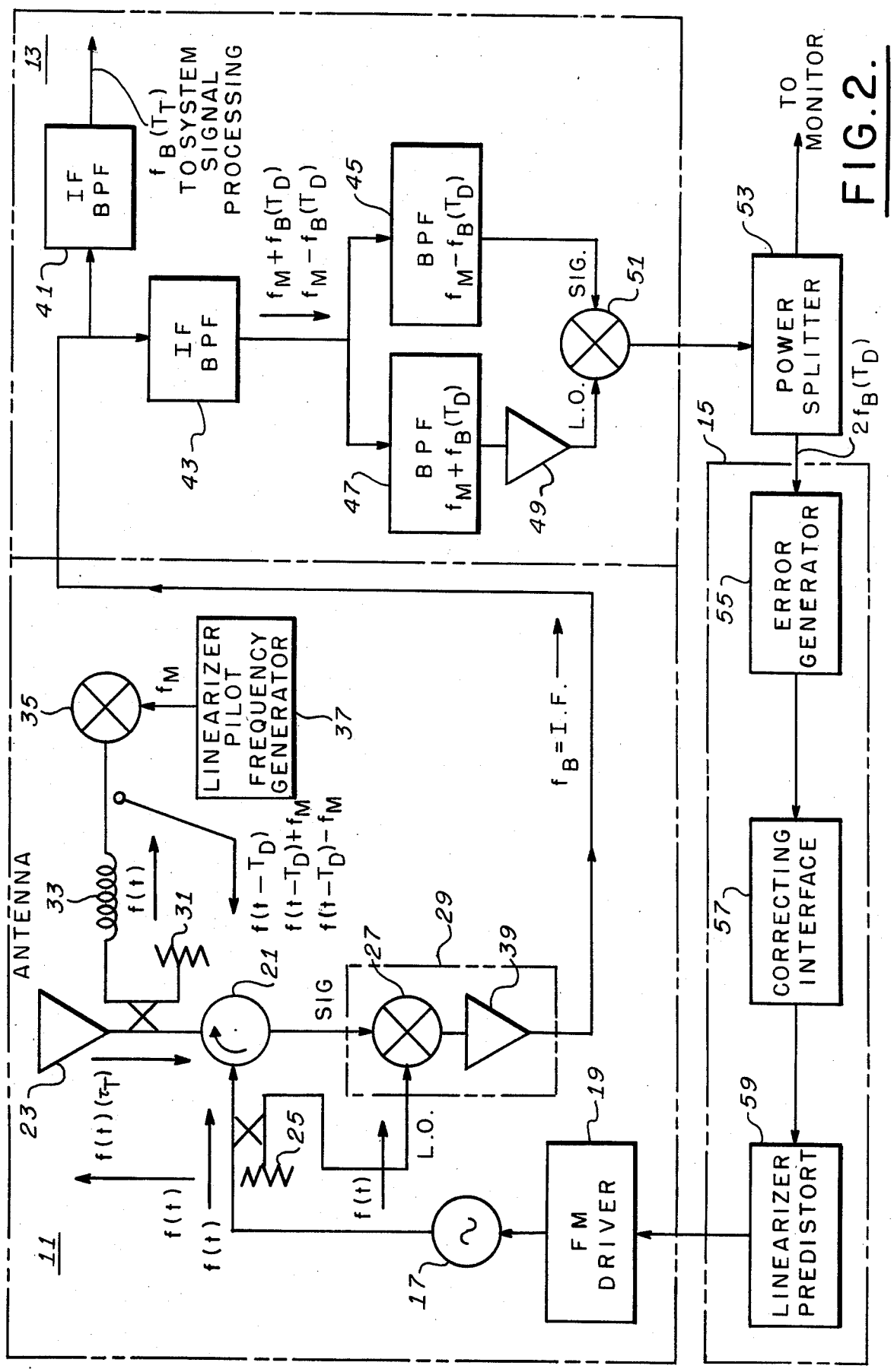
FIG. 2 is a block diagram illustrating a linearizer circuit employing the principles of the invention.

FIG. 2 illustrate as linearizer constructed in accordance with the principles of the invention.

The linearizer contains three subassemblies, viz: an RF subassembly 11, an IF subassembly 13, and a signal processor subassembly 15.

The RF subassembly includes a VCO 17 driven by an FM driver 19.

The output signal f(t) from the VCO is applied to a circulator 21 which in turn is coupled to the radar system antenna 23. The VCO output signal is also sampled in an RF coupler 25 and applied as a local oscillator signal to a mixer 27 in a mixer-preamplifier 29. The VCO output signal applied to the antenna is also sampled in an RF coupler 31 and applied through a delay line 33 to a known type of PIN diode modulator 35 where it is amplitude modulated in response to a modulating signal from a frequency generator 37. Typically, PIN modulators are capable of attenuating an input signal by 20 dB in response to a modulating voltage swing of 1 volt. The modulation frequency is chosen to pass through subsequent filtering means (to be described which separate the control signals from the target return signals. Typically, the modulation frequency may be set at 40 MHz whereas the target return signal may produce an 85 MHz IF signal.

Assuming the modulation frequency to be $f_M$, several modulation signal trains will be reflected from the modulator 35 back through the delay line 33 as indicated in FIG. 2. Each of these signals will have experienced a round-trip time delay indicated as $T_D$ in FIG. 2. These delayed signal trains pass through the circulator 21 to the mixer 27 where they are mixed with the f(t) signal coupled from the RF coupler 25 to form corresponding $f_B$ beat signals as indicated in FIG. 2.

When the reflected signal returns from the target, it will have experienced a time delay $T_T$. This time delay, it will be appreciated, is much longer than the delay provided by the delay line 33. The target return signal passes through the circulator 21 and the mixer 27 where it beats with f(t) signal from the RF coupler.

Typically, the target return beat signal is in the order of 85 MHz whereas the delay line beat signal is in the order of 40 MHz.

The resulting composite IF signal is applied to the IF subassembly 13 through an amplifier 39 in the mixer-preamplifier 29.

The composite IF signal is applied to a first bandpass filter 41 which blocks all signals except the beat frequency signal arising from the target return signal. The output of this filter can be applied to external utilization circuitry in the radar system.

The composite IF signal is also applied to a second bandpass filter 43 which passes only the upper and lower sidebands arising from the delay line return signals. These sidebands signals are applied to upper and lower sideband filters 45 and 47. The output of the sideband filter 47 is amplified in an amplifier 49 to a suitable level for use as a local oscillator signal and mixed with the signal from the sideband filter 45 in a mixer 51.

The output of the mixer 51 may be applied to a power splitter 53 which includes filtering means for passing the difference signal which constitutes a control beat signal equal to $2f_B(T_D)$ to the processor subassembly 15. Typically, an additional signal may be extracted in the power splitter and used to monitor the system performance.

Figure 1B:
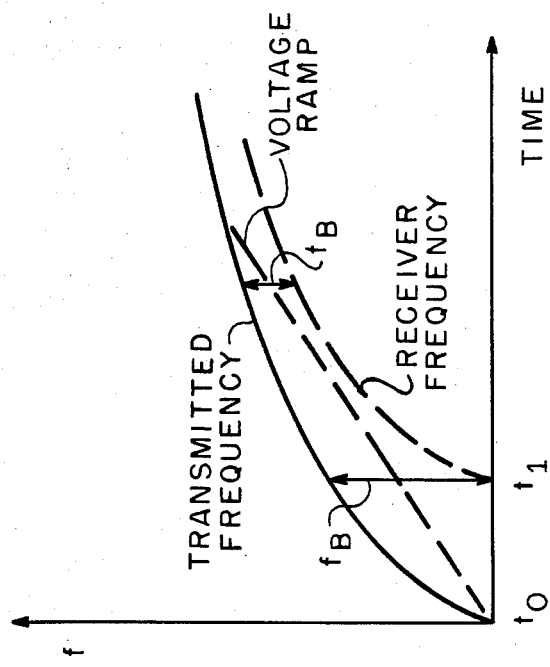
FIGS. 1(a) and 1(b) are graphical representations illustrating the operation of FMCW radar system.
Figure 1A:
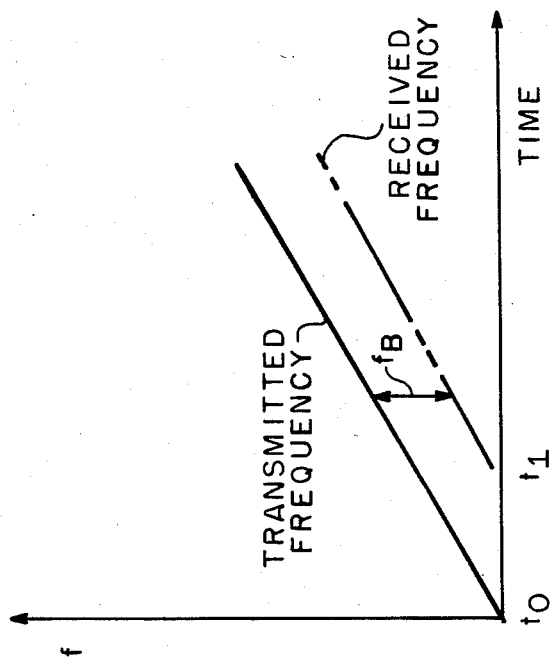

The nature of the beat frequency control signal can be visualized by again referring to FIGS. 1(a) and 1(b).

As in the case with the transmitted and target return signals depicted in FIG. 1, the control signal $f_B$, produced in response to the signals in delay line 33 and modulator 35 will be of constant frequency throughout a normal sweep interval, but will vary in frequency when the frequency output of the VCO changes non-linearly during a given sweep interval.

Effectively, the RF and IF subassemblies function as a frequency discriminator which produces control signals indicative of deviations from the desired transmitter frequency and suitable for utilization in the linearizer signal processing means.

It will be recalled that the processor subassembly 15 of the present invention is essentially the same as the corresponding subassembly of the aforementioned co-pending patent application.

The control signals produced in the RF—IF subassemblies of this earlier application as well as the beat frequency control signals of the present invention are used to control timing circuits in the respective processor subassemblies. These timing circuits are actuated by the control signals and normally operate within optimum frequency limits established by the design parameters of a particular application.

The control signal frequency of the present invention is twice the internally generated beat frequency and is directly proportional to the delay provided by the delay line. Therefore to produce a given beat frequency the length of the delay line can be halved by using the circuit of the present invention. Since space is frequently limited in applications in which such linearizers are used and the delay lines tend to be bulky, such a shortening of the delay line can be of significant importance. Additionally shortening of the delay line significantly reduces signal attenuation, thereby providing greatly improved signal-to-noise ratios for the control signal.

Since the control signal frequency is an exact multiple of the beat frequency, the same signal can be used to actuate external continuous montioring apparatus if desired.

The type of signal processor with which the control signal generating means of the present invention is intended to be used is explained in detail in co-pending patent application Ser. No. 696,236 but is illustrated in block form in FIG. 2 for ease of reference. Essentially, the signal processor 15 includes an error generator 55 which serves to produce a series of error signals during each sweep cycle of the VCO, a correcting interface 57 which convert these error signals into a corresponding series of correction voltages, and a linearizer predistort means 59 for altering the shape of the VCO drive voltage in response to the correction voltages so as to linearize the frequency versus time characteristics of the VCO output.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. An improved linearizer circuit for use in a frequency modulated continuous wave radar system of the type employing a VCO for generating frequency swept signals to be transmitted and a linearizer feedback circuit which couples a series of frequency correction signals to the VCO during each frequency sweep, the improved linearizer comprising first and second means for continuously sampling output signals of said VCO, first mixer means coupled to receive signals from said first sampling means, amplitude modulation means for amplitude modulating signals at a modulating frequency, signal delay means coupled between said second sampling means and said amplitude modulation means for providing a time delay to signals incident to and reflected from said amplitude modulation means to couple delayed amplitude modulated signals to said first mixer means, said delayed amplitude modulated signals having a delay relative to said output signals equal to twice said time delay such that said delayed amplitude modulated signals and sampled output signals coupled from said second sampling means are mixed in said first mixer means to produce an intermediate frequency signal having upper and lower sidebands, filter means coupled to receive said intermediate frequency signal for separating said upper and lower sidebands, and second mixer means coupled to receive said upper and lower sidebands for producing a beat frequency control signal for controlling operations of said linearizer.

2. The linearizer of claim 1 wherein said signals from said first sampling means coupled to said first mixer means constitutes a local oscillator signal and wherein said delayed amplitude modulated signals include first and second component signals having frequencies respectively equivalent to frequencies of said output signals twice delayed by said signal delay means plus and minus said modulating frequency, and wherein said intermediate frequency signal from said first mixer includes first and second sidebands, respectively, having frequencies equivalent to said modulating frequency plus and minus a beat frequency between frequencies of said output signals and frequencies of said output signals twice delayed by said delay means, said linearizer further characterized in that said filter means includes individual filters for passing only said upper and lower sidebands, respectively, and wherein said second mixer means passes a difference signal for controlling operations of said linearizer having a frequency equal to twice said beat frequency.

3. The linearizer of claim 1 wherein said VCO is coupled to a system antenna through a circulator and said signal delay means is coupled to a transmission line intercoupling said antenna and said circulator, said circulator being further coupled to said first mixer means so that VCO output signals are directed to said antenna and said signal delay means, whereas target return signals and delay line return signals are directed to said first mixer means, said first mixer means being further coupled to receive a local oscillator signal from said transmission line intercoupling said VCO and said circulator.

4. The linearizer of claim 3 further including filter means to pass target return signal components in said intermediate frequency signal to signal processing circuits in an associated radar system.

5. The linearizer of claim 4 further containing a power splitter coupled to receive said difference signal from said second mixer and to pass a first portion of said difference signal to signal processing means for providing linearization signals to said VCO and a second portion to external means for monitoring system performance.

6. A frequency discriminator for producing a beat control signal indicative of instantaneous frequencies generated by a voltage controlled oscillator in response to periodic sawtooth control voltages, said discriminator means including means for sampling output signals of said oscillator, amplitude modulating means coupled to said sampling means through signal delay means such that a sampled signal is delayed, modulated and reflected back through said delay means, first mixer means coupled to receive said reflected signal from said delay means, said first mixer means being further coupled to receive a second sample of output signals of said oscillator and to mix said second sample signal with said reflected signal, filter means to isolate upper and lower sidebands resulting from mixing said second sample and said reflected signals, and second mixer means for combining said upper and lower sidebands to produce a beat control signal.

* * * * *